US006954109B2

(12) United States Patent
Heinonen et al.

(10) Patent No.: US 6,954,109 B2
(45) Date of Patent: Oct. 11, 2005

(54) PROVISION OF LOCAL OSCILLATOR SIGNALS

(75) Inventors: Jarmo Heinonen, Pertteli (FI); Markus Pettersson, Kirkkonummi (FI); Sami Vilhonen, Littoinen (FI)

(73) Assignee: Nokia Corporation, Espoo (FI)

( * ) Notice: Subject to any disclaimer, the term of this patent is extended or adjusted under 35 U.S.C. 154(b) by 103 days.

(21) Appl. No.: 10/643,599

(22) Filed: Aug. 18, 2003

(65) Prior Publication Data

US 2005/0040894 A1 Feb. 24, 2005

(51) Int. Cl.[7] .............................. H03L 7/07; H04B 1/00
(52) U.S. Cl. .............................. 331/2; 331/16; 331/49; 455/260
(58) Field of Search .............................. 331/2, 16, 18, 331/25, 49; 327/147–150; 332/127; 360/51; 375/376; 455/260

(56) References Cited

U.S. PATENT DOCUMENTS 6,356,770 B1 * 3/2002 Ishida .................... 455/553.1

FOREIGN PATENT DOCUMENTS

| EP | 0526202 | 2/1993 |
|----|---------|--------|
| EP | 1313220 | 5/2003 |
| EP | 1320189 | 6/2003 |

* cited by examiner

*Primary Examiner*—David Mis
(74) *Attorney, Agent, or Firm*—Alfred A. Fressola; Ware, Fressola, Van Der Sluys & Adolphson (57) ABSTRACT

The invention relates to a phase-locked loop structure providing local oscillator signals. In order to enable an improved supply of local oscillator signals, the phase-locked loop structure comprises a first phase-locked loop including a first voltage controlled oscillator and a second phase-locked loop including a second voltage controlled oscillator. A first local oscillator output provides a first local oscillator signal, wherein a signal output by the first voltage controlled oscillator is forwarded to the first local oscillator output. A second local oscillator output provides a second local oscillator signal. A selection component forwards a signal output by the first voltage controlled oscillator or a signal output by the second voltage controlled oscillator to the second local oscillator output. The invention relates equally to a corresponding communication unit and to a corresponding method.

14 Claims, 7 Drawing Sheets

PROVISION OF LOCAL OSCILLATOR SIGNALS

FIELD OF THE INVENTION

The invention relates to a phase-locked loop structure providing local oscillator signals and to a communication unit comprising such a phase-locked loop structure. The invention relates equally to a method of providing local oscillator signals.

BACKGROUND OF THE INVENTION

Local oscillator (LO) signals are required in various applications. In a cellular phone, for example, local oscillator signals are needed as input to a receiver mixer for downconverting a received radio frequency (RF) signal and as input to a transmitter mixer for upconverting a signal which is to be transmitted as radio frequency signal.

A local oscillator signal is usually provided by a voltage controlled oscillator (VCO) which forms a part of a phase-locked loop (PLL). For a cellular phone, generally two separate phase locked loops are used, a first one with a first VCO handling all frequency bands required for reception (RX) and a second one with a second VCO handling all frequency bands required for transmission (TX).

Figure 1:
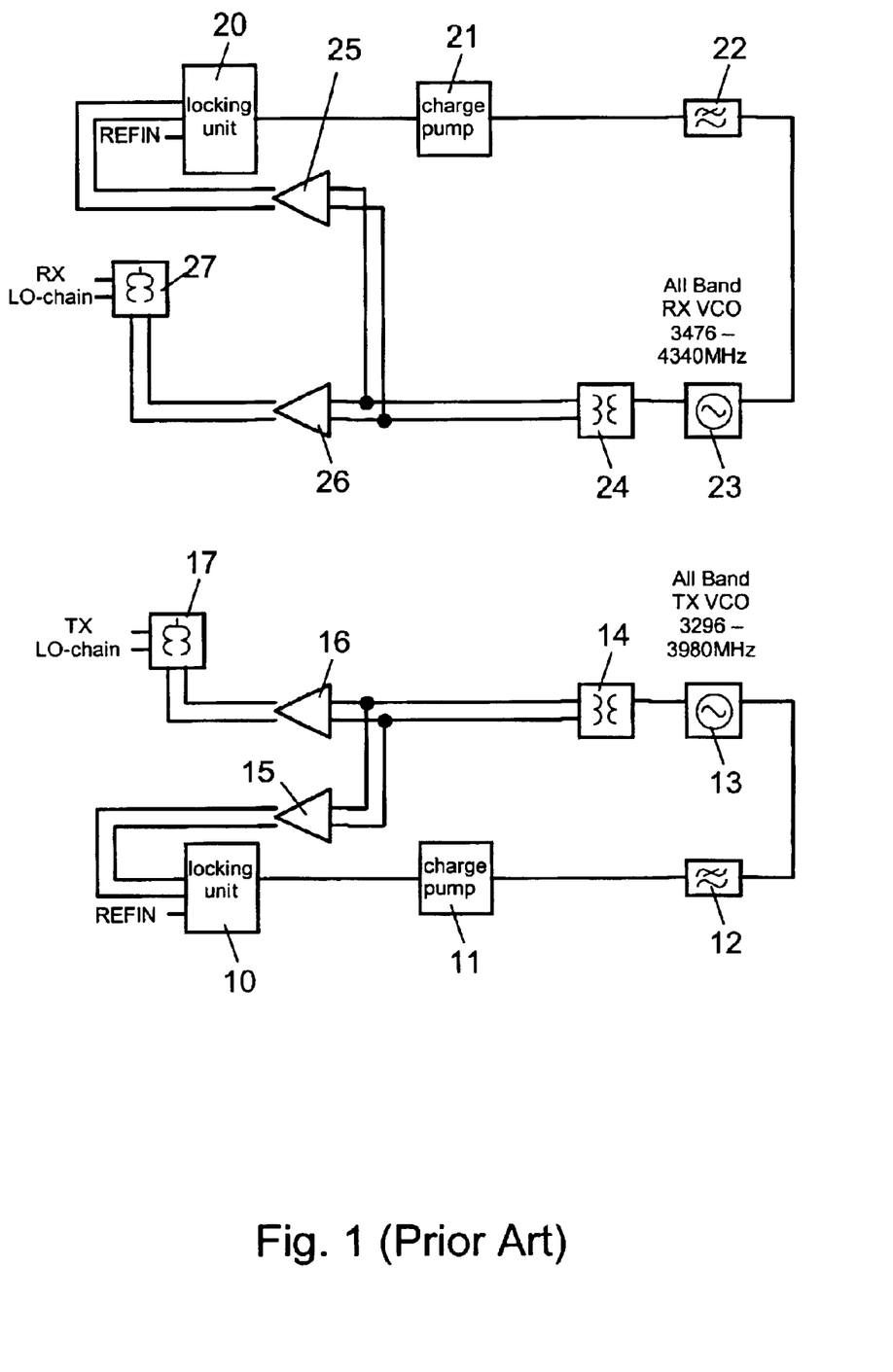
FIG. 1 schematically presents a known PLL structure.

For illustration, FIG. 1 presents a conventional implementation of a PLL structure with two PLLs for a cellular phone. The PLLs are also referred to as synthesizer loops.

In the lower half of FIG. 1, a first PLL includes a locking unit 10 with a programmable reference input, a LO signal prescaler, programmable dividers and a phase detector. The output of the locking unit 10 is connected in a row to a charge pump 11, a loop filter 12, an all band TX VCO 13 having a frequency range of 3296 MHz to 3980 MHz and a transformer 14. This frequency range is suited for example for an LO signal for GSM (Global System for Mobile Communications) and WCDMA (Wideband Code Division Multiple Access) transmissions. The output of the transformer 14 is connected on the one hand via a first buffer 15 to the input of the locking unit 10, thereby closing the first PLL. The output of the transformer 14 is connected on the other hand via a second buffer 16 to an LO output 17 providing an LO signal for the TX chain (not shown) of the cellular phone.

In the upper half of FIG. 1, a second PLL is depicted. The second PLL has an identical structure as the first PLL and comprises thus as well a locking unit 20, a charge pump 21, a loop filter 22, a VCO 23, a transformer 24 and a first buffer 25 arranged in a loop. In this case, however, the VCO 23 is an all band RX VCO having a frequency range of 3476 MHz to 4340 MHz. This frequency range is suited for example for an LO signal for GSM and WCDMA receptions. The output of the transformer 24 is connected outside of the second PLL via a second buffer 26 to an LO output 27 providing an LO signal for the RX chain (not shown) of the cellular phone.

The two PLLs of the PLL structure operate in a well known manner. A reference signal having a programmed frequency is applied to the reference input of the respective locking unit 10, 20. Further, the current output signal of the respective VCO 13, 23 is provided via the respective transformer 14, 24 and the respective first buffer 15, 25 to an input of the respective locking unit 10, 20. The transformer 14, 24 is used for transforming the single-ended output provided by the discrete TX VCO 13, 23 to the differential signal which is often required by integrated PLL components. It is to be noted that in case of integrated VCOs, the respective VCO 13, 23 could have a differential output itself. In this case, the respective transformer 14, 24 would not be needed. The frequency of the VCO signal is first divided in the respective locking unit 10, 20 by the LO prescaler and then by the programmable frequency dividers. The phase detector compares the phase of the frequency divided VCO signal with the phase of the reference signal and outputs an error signal, which constitutes at the same time the output of the locking unit 10, 20. The PLL is locked when the two phases are equal, which implies that also the frequencies of the signals are equal.

For achieving or maintaining a locked state, the respective charge pump 11, 21 generates current impulses, the length of which are controlled by the output signal of the respective locking unit 10, 20. The generated current pulses are filtered by the respective loop filter 12, 22, which provides a corresponding control voltage to the respective VCO 13, 23 and thus takes care that the VCO 13, 23 generates a signal which is locked to a desired frequency. The frequency of the signals output by the VCOs 13, 23 can be changed by changing the factor in the programmable dividers in the respective locking unit 10, 20. The phase locked VCO signal is buffered by the respective second buffer 16, 26 and provided to the respective LO output 17, 27, which may also realize an output matching.

One aspect that has to be taken into account when designing a PLL structure for a cellular phones is the current consumption, which should be as low as possible in order to save battery power. The current consumption of the PLL structure is mainly determined by the quality of the VCO signals required by the respective RF and RF system specifications. The quality of the signal includes for example the phase noise, the signal to noise floor, the output power, the environmental stability, etc. Moreover, the current consumption of a VCO increases with the frequency band which has to be covered.

Different systems have different requirements and possibilities to lower the power consumption, which is of particular importance for cellular phones supporting different systems. A GSM/WCDMA multimode/multiband phone supports for example a GSM based system and as well a WCDMA based system. These multimode/multiband systems require a wide frequency band for their RX LO signal. GSM based systems in general require a higher signal quality for their RX LO signal than WCDMA based systems. WCDMA based systems, on the other hand, generally require a very low power consumption of the VCOs, because these have to be turned on almost all the time during a conversation.

Also within the same system, different phone usage conditions, like the network environment, require different purity from the VCO signal. More specifically, when no disturbing high-level signals are present, a lower VCO signal quality is required than in case such disturbing high-level signals are present.

In order to reduce the current consumption, there is the possibility to switch off a VCO and possibly an entire PLL. Whenever the cellular phone is not receiving an RF signal or not transmitting an RF signal, the concerned VCO and PLL can be switched off, while taking care that the PLL is settled at the right time. Usually, however, the PLL loops are powered all the time in the conversation mode of GSM.

In order to be able to use low performance VCOs with low power consumption in a WCDMA mode of a combined GSM/WCDMA cellular phone, it has further been proposed to employ three phase locked loops with three VCOs. One VCO is used in such a system for the RX and TX frequency bands needed for GSM, a second VCO is used for the RX frequency bands needed for WCDMA and a third VCO is used for the TX frequency bands needed for WCDMA. It is a disadvantage of this approach, though, that an additional VCO is required.

Another aspect that has to be taken into account when designing a PLL structure for a cellular phones is time critical situations. In a time critical situation, the frequency of an LO signal has to change quickly, while a PLL requires some time for settling to a newly set frequency.

SUMMARY OF THE INVENTION

It is an object of the invention to enable an improved supply of local oscillator signals.

A phase-locked loop structure providing local oscillator signals is proposed, which comprises a first phase-locked loop including a first voltage controlled oscillator and a second phase-locked loop including a second voltage controlled oscillator. The proposed phase-locked loop structure further comprises a first local oscillator output for providing a first local oscillator signal, wherein a signal output by the first voltage controlled oscillator is forwarded to the first local oscillator output, and a second local oscillator output for providing a second local oscillator signal. In addition, the proposed phase-locked loop structure comprises a selection component, e.g. a multiplexer, for forwarding a signal output by the first voltage controlled oscillator or a signal output by the second voltage controlled oscillator to the second local oscillator output.

Moreover, a communication unit like a cellular phone is proposed, which comprises the proposed phase-locked loop structure, a transmitter chain requiring a local oscillator signal for processing signals for transmission and a receiver chain requiring a local oscillator signal for processing received signals. One of the first local oscillator output and the second local oscillator output provides a local oscillator signal to the transmitter chain and the respective other one of the first local oscillator output and the second local oscillator output provides a local oscillator signal to the receiver chain.

Finally, a method of providing a first local oscillator signal and a second local oscillator signal is proposed. In this method, a signal provided by a first voltage controlled oscillator of a first phase locked loop is used as the first local oscillator signal, in case the first local oscillator signal is required. In case the second local oscillator signal is required, a signal provided by one of the first voltage controlled oscillator and a second voltage controlled oscillator of a second phase locked loop is selected for use as the second local oscillator signal.

The invention proceeds from the consideration that if a PLL structure comprises two VCOs for providing signals to two LO outputs, at least one of these LO outputs could be provided in a selectable manner with the signal generated by either of the two VCOs, depending on a current situation. Since one of the VCOs is thus used for providing a signal to both LO outputs, no extra VCO is needed for enabling the selection. Depending on the system in which the PLL structure is implemented and on the design of the VCOs, the selection can be carried out for instance in a way that the current consumption of the system is reduced, that a time-critical performance is improved, that the simplicity and/or the costs of the PLL structure is optimized, or that a suitable compromise for these aspects is achieved.

Compared to the known PLL structure using three VCOs, it is an advantage of the invention that one VCO can be saved with the proposed switching possibility. Compared to the known PLL structure using two VCOs, it is an advantage of the invention that one VCO with a lower power consumption can be employed. Due to the switching possibility, the performance of the unit in which the PLL structure is implemented can nevertheless be as good as before, while in various situations a significantly lowered power consumption can be achieved, e.g. in various situations during the talk and idle times of a cellular phone. Compared to both known cases, it is an advantage of the invention that it allows achievement of a benefit in time critical systems.

The invention can be implemented in particular, though not exclusively, in a cellular phone supporting two systems with different requirements, like a GSM/WCDMA multimode/multiband phone. The first LO signal is then provided to a transmitter chain of the cellular phone and the second LO signal to a receiver chain of the cellular phone, or vice versa.

One embodiment of the invention can be used in the case that the second LO signal is needed from a wider frequency range in a first situation and from a narrower frequency range in a second situation. The two VCOs are selected such that the first VCO, which provides as well a signal to the first LO output, covers at least the wider frequency range and the second VCO at least the narrower frequency range. The second VCO can therefore have a lower current consumption. A signal originating from the first VCO is then provided to the second LO output whenever a second LO signal is required in the first situation, and a signal originating from the second VCO is provided to the second LO output whenever a second LO signal is required in the second situation. In a GSM/WCDMA cellular phone, the first situation may be for example a GSM reception and the second situation a WCDMA reception. In the case of GSM/WCDMA, the second VCO may have in addition a lower performance, which leads to a further reduction of the current consumption.

Another embodiment of the invention can be used in the case that the quality of the second LO signal has to be higher in a first situation than in a second situation.

The two VCOs are selected such that the first VCO, which provides as well a signal to the first LO output, outputs a signal complying with the higher quality requirements and that the second VCO outputs a signal complying with the lower quality requirements. The second VCO can therefore have a lower current consumption. The signal generated by the first VCO is then provided to the second LO output whenever a second LO signal is required in the first situation, and the signal generated by the second VCO is provided to the second LO output whenever a second LO signal is required in the second situation.

In a GSM/WCDMA cellular phone, for example, the first situation may be given in the case of GSM reception in a less favorable spectral environment, while the second situation may be given in the case of WCDMA reception and/or in the case of GSM reception in a favorable spectral environment. GSM based systems require a significantly better LO signal quality for reception when high blocking levels exist than when low blocking levels exist. The requirements on the quality of received signals and the employed system thus determine the requirement for the quality of the to be selected VCO signal, and thereby the necessary current consumption. In order to minimize the power consumption, the quality of the selected VCO signal should always be close to the needed minimum quality.

Information on the required quality of the second LO signal that can be used as a basis for the selection of one of the VCOs is difficult to obtain. But cellular phones calculate the signal-to-noise ratio (SNR) of received signals inside a digital signal processing (DSP) software for enabling the sleep stages of the receiver. This information is still available in the conversation mode. By using this information it is possible to notice a poor performance, i.e. a low SNR causing bad BER values, which requires a high quality of an RX LO signal. Thus, the SNR, which is calculated by the DSP software for example for each burst or for a certain time period, can be used to determine the right VCO to be used for the second LO signal. When the SNR is sufficiently good, then a signal originating from the low quality second VCO can be provided to the second LO output. When the SNR is getting worse or falls below a predetermined level, then the signal originating from the high quality first VCO is provided to the second LO output, so that the SNR reaches an acceptable level.

In addition, radio frequency components could be designed with different power control modes and/or tunable power consumption. A DSP software may then be developed which uses the SNR which is available in DSP code. This allows the ability to tune or change the current consumption mode of the radio frequency components or part of the radio frequency components whenever the SNR falls below a certain limit or to try to keep the SNR value above a certain limit. For example, most parts of the proposed phase-locked loop structure could be integrated to a radio frequency component. This radio frequency component can then have programmable power control modes by selecting one of different VCOs.

In yet another embodiment of the invention, the switching is used for supporting time-critical situations, e.g. multislot cases of GSM. In this case, for instance the first VCO can be settled to a new frequency, while the second VCO is still used as source for the second LO signal. When the new frequency is required, the signal originating from the first VCO can then be provided immediately as second LO signal, without a transition period being required for settling to a new frequency as in the case of a single VCO.

One or both of the VCOs, or the corresponding entire PLL, can further be turned off whenever possible to maximize the savings in the power consumption. With systems using time division duplex, it is even possible to shut off the VCO and the whole PLL for certain periods between the bursts which are to be received or to be transmitted.

The invention is particularly suited for highly integrated transceivers of cellular phones. The PLLs and buffers, which are used for connecting the VCOs of the PLLs to the LO signal output, can easily be designed as a totally integrated system.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not drawn to scale and that they are merely intended to conceptually illustrate the structures and procedures described herein.

DETAILED DESCRIPTION OF THE INVENTION

FIG. 1 has already been described above.

Figure 2:
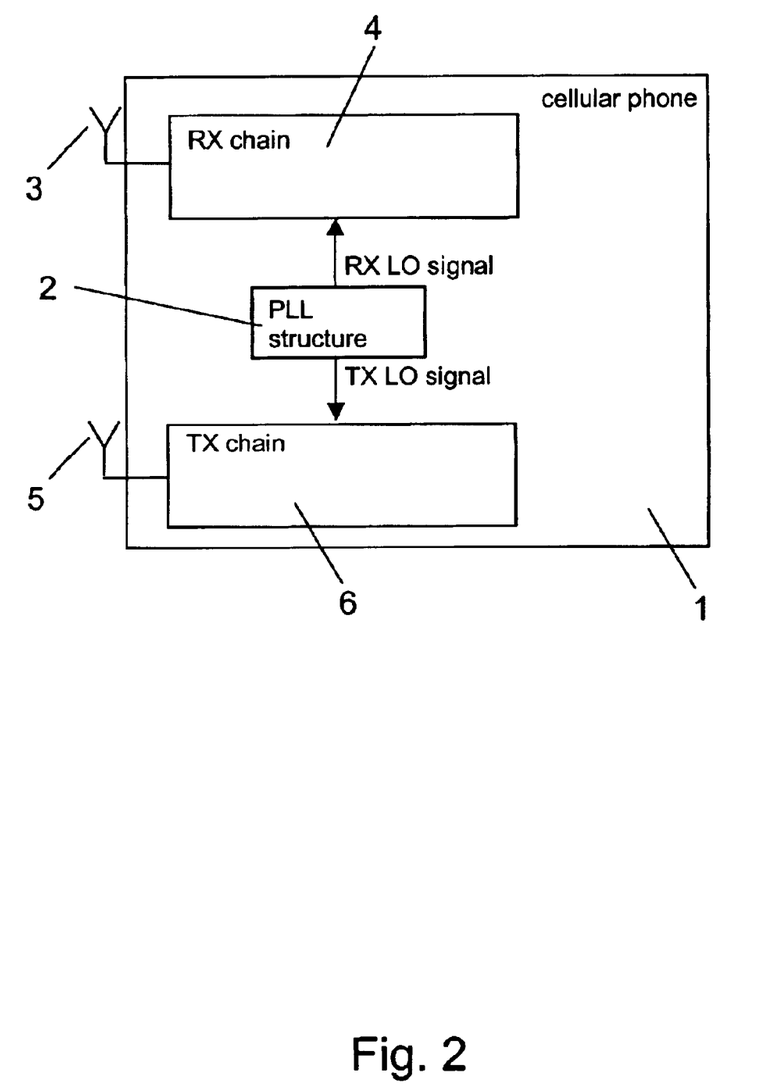
FIG. 2 schematically presents a cellular phone in which a PLL structure according to the invention can be implemented.

FIG. 2 schematically presents a GSM/WCDMA multimode/multiband cellular phone 1 in which a PLL structure 2 according to the invention can be implemented. The phone 1 comprises a first antenna 3 connected to an RX chain 4 including a receiver mixer, and a second antenna 5 connected to a TX chain 6 including a transmitter mixer. The PLL structure 2 provides an RX LO signal to a receiver mixer of the RX chain 4 for enabling a GSM or WCDMA reception as known in the state of the art and provides a TX LO signal to a transmitter mixer of the TX chain 6 for enabling a GSM or WCDMA transmission as known in the state of the art.

Figure 3:
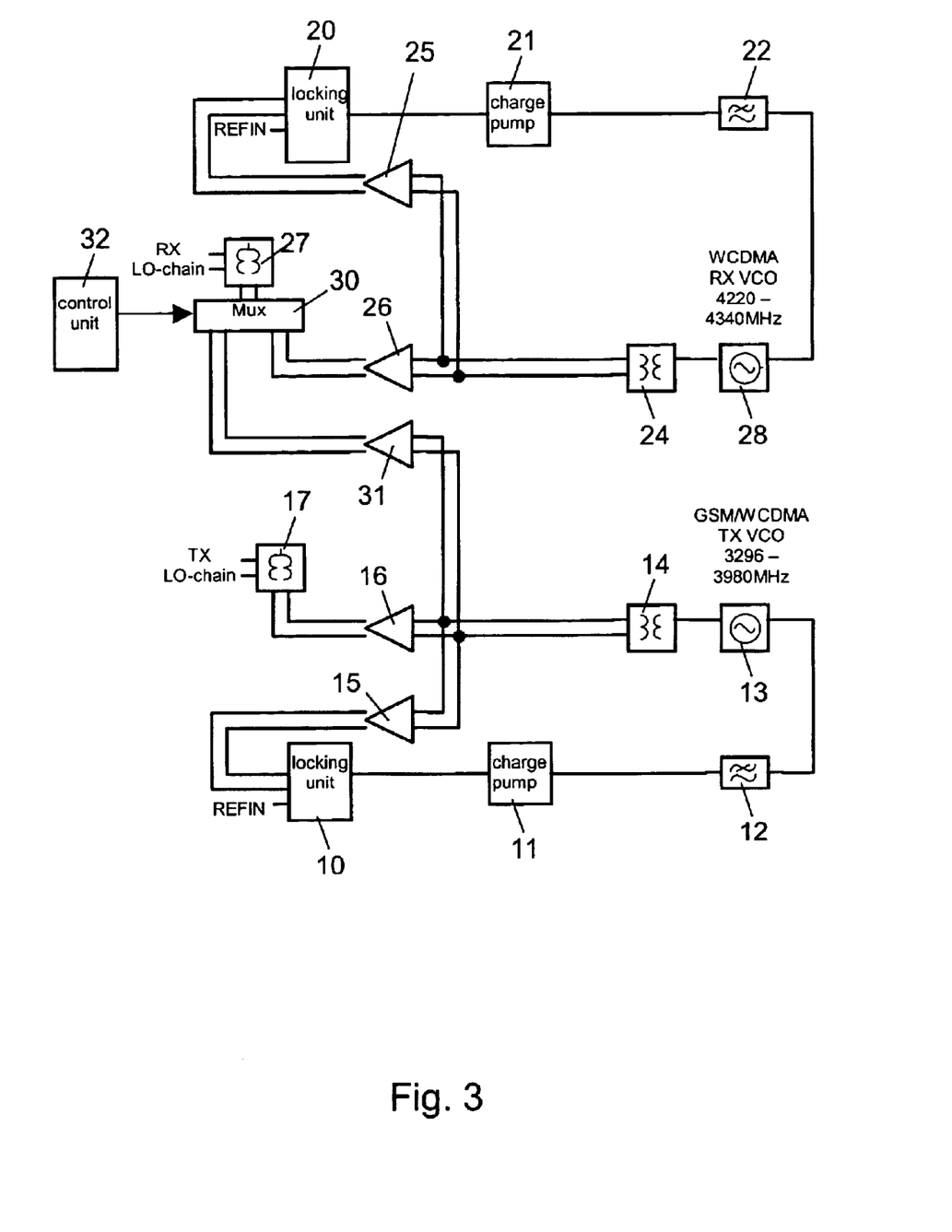
FIG. 3 schematically presents a first embodiment of a PLL structure according to the invention.

FIG. 3 schematically presents a first embodiment of a PLL structure according to the invention, which can be used for instance as the PLL structure 2 of the cellular phone of FIG. 2.

The PLL structure of FIG. 3 proceeds from the PLL structure presented in FIG. 1 and comprises again two PLLs. The same reference signs as in FIG. 1 are used for corresponding elements.

The first PLL of the PLL structure of FIG. 3 is identical to the first PLL of FIG. 1. It thus comprises again a locking unit 10, a charge pump 11, a loop filter 12, an TX VCO 13, a transformer 14 and a first buffer 15 connected to each other in a loop. As in FIG. 1, the VCO 13 is an all-band TX VCO supporting a frequency range of 3296 MHz to 3980 MHz, i.e. the frequency range required for supporting both, GSM and WCDMA transmissions. Moreover, it satisfies the high quality requirements of the GSM system. The TX VCO 13 can be in particular a standard GSM VCO, which may be suited for handling the four possibly required frequency bands, i.e. the 850 MHz, the 900 MHz, the 1800 MHz and the 1900 MHz frequency band. The TX VCO 13 is connected via a second buffer 16 to an TX LO output 17. The TX LO output 17 is connected to the mixer of the TX chain of the cellular phone.

Also the second PLL of the PLL structure of FIG. 3 comprises again a locking unit 20, a charge pump 21, a loop filter 22, a RX VCO 28, a transformer 24 and a first buffer 25 connected to each other in a loop. The VCO 28, however, is not an all-band RX VCO as in FIG. 1, but a standard WCDMA RX VCO supporting a frequency band of 4220 MHz to 4340 MHz. Thus, the RX VCO 28 is more narrow-band than the RX VCO 23 of FIG. 1. The VCO 28 can moreover be a small component with a low power consumption, which only has to guarantee the low signal quality which is required for WCDMA. The output of the transformer 24 is further connected via a second buffer 26 and a first input of a multiplexer 30 to an RX LO output 27. The RX LO output 27 is connected to the mixer of the RX chain of the cellular phone.

In addition, the TX VCO 13 of the first PLL is connected via a third buffer 31 and a second input of the multiplexer 30 to the RX LO output 27.

A control unit 32 is connected to a control input of the multiplexer 30 and causes the multiplexer 30 to forward either a signal originating from the TX VCO 13 or a signal originating from the RX VCO 28 to the RX LO output 27. Thus, there are two routes for providing an LO signal to the receiver chain.

The operation of the two PLLs is the same as described above with reference to FIG. 1. The switching between the PLLs of FIG. 3 is illustrated in the flow chart of FIG. 4.

Figure 4:
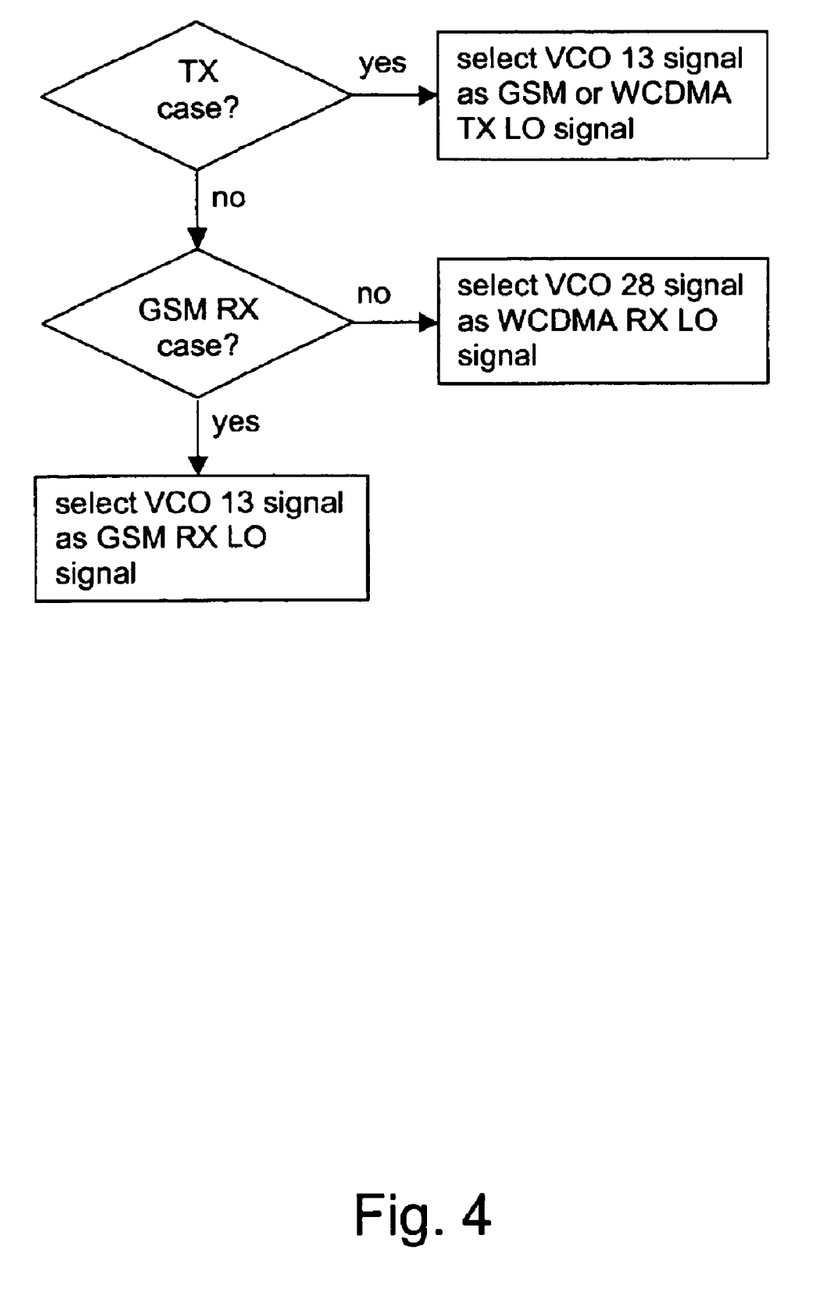
FIG. 4 is a flow chart illustrating the switching in the PLL structure of FIG. 3.

When a GSM or WCDMA transmission is needed, the TX VCO 13 is set to the required frequency and the output signal is provided via the RX LO output 17 to the transmitter chain, as known in the state of the art.

When a WCDMA reception is needed, the RX VCO 28 is set to the required frequency and the output signal is provided to the multiplexer 30. The control unit 32 applies a control signal to the multiplexer 30 which causes the multiplexer 30 to forward the signal originating from the RX VCO 28 to the RX LO output 27.

When a GSM reception is needed, the TX VCO 13 is set to the required frequency and the output signal is provided to the multiplexer 30. The control unit 32 applies a control signal to the multiplexer 30 which causes the multiplexer 30 to forward the signal originating from the TX VCO 13 to the RX LO output 27. This is possible, since today, GSM multislot classes are not duplex and thus do not require simultaneous RX and TX LO signal generation.

On the whole, it becomes apparent that an RX VCO 28 can be used which supports only a narrow frequency band and which guarantees only a limited quality of its output signal, and which thus has a low current consumption. Such an RX VCO is suited e.g. for WCDMA receptions. For WCDMA, a reduction of the current consumption in the RX VCO is of particular importance as the RX VCO power consumption is present in both, idle and talk mode. At the same time, reception of GSM signals is also enabled by switching the TX VCO 13 to the RX LO output 27. Thus, extra circuitry can be avoided that might be used otherwise to reach the current consumption performance requirements on each system of a multi-mode phone, e.g. by using separate VCOs for each system.

Figure 5:
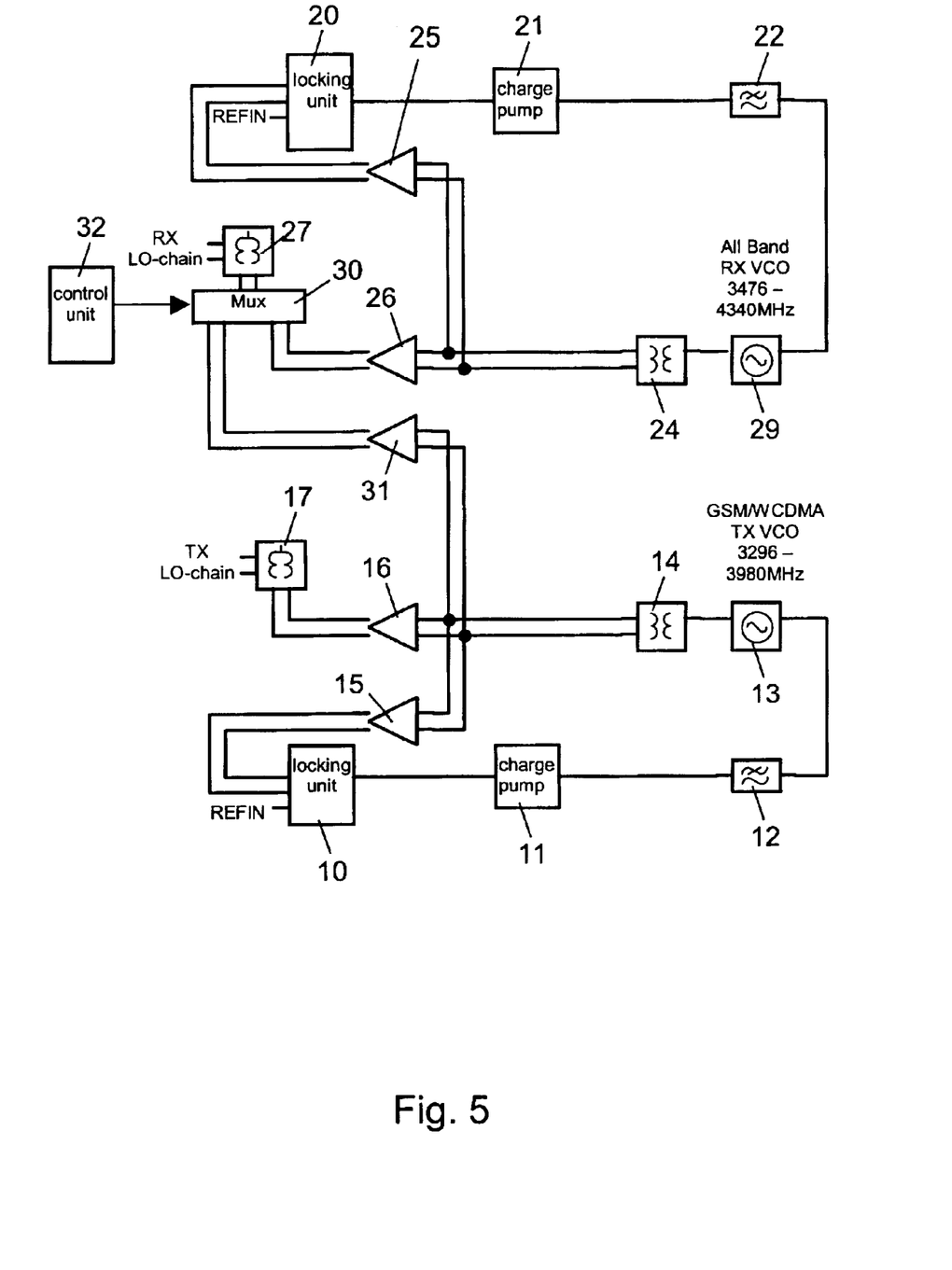
FIG. 5 schematically presents a second embodiment of a PLL structure according to the invention.

FIG. 5 schematically presents a second embodiment of a PLL structure according to the invention. The PLL structure is again part of a GSM/WCDMA multimode/multiband cellular phone and provides a LO signal for supporting GSM or WCDMA reception and a LO signal for supporting GSM or WCDMA transmission.

The structure of FIG. 5 is identical to the structure of FIG. 3, except that the RX VCO 29 of the second PLL is an all band RX VCO supporting a frequency band of 3476 MHz to 4340 MHz. Except for the RX VCO 29, the same reference signs as in FIG. 3 are used for corresponding elements.

In a first alternative, the RX VCO 29 of the PLL structure of FIG. 5 has a low performance specification and has thus a rather low current consumption in spite of the coverage of a wide frequency band. The low performance specification defines more specifically low technical requirements for the VCO 29 which only allow to fulfill the LO signal requirements for WCDMA, not for GSM. Further, the control unit 32 is a unit comprising the DSP software of the cellular phone.

The operation of the two PLLs is the same as described above with reference to FIG. 1. The switching between the PLLs of FIG. 5 in the first alternative is illustrated in the flow chart of FIG. 6.

Figure 6:
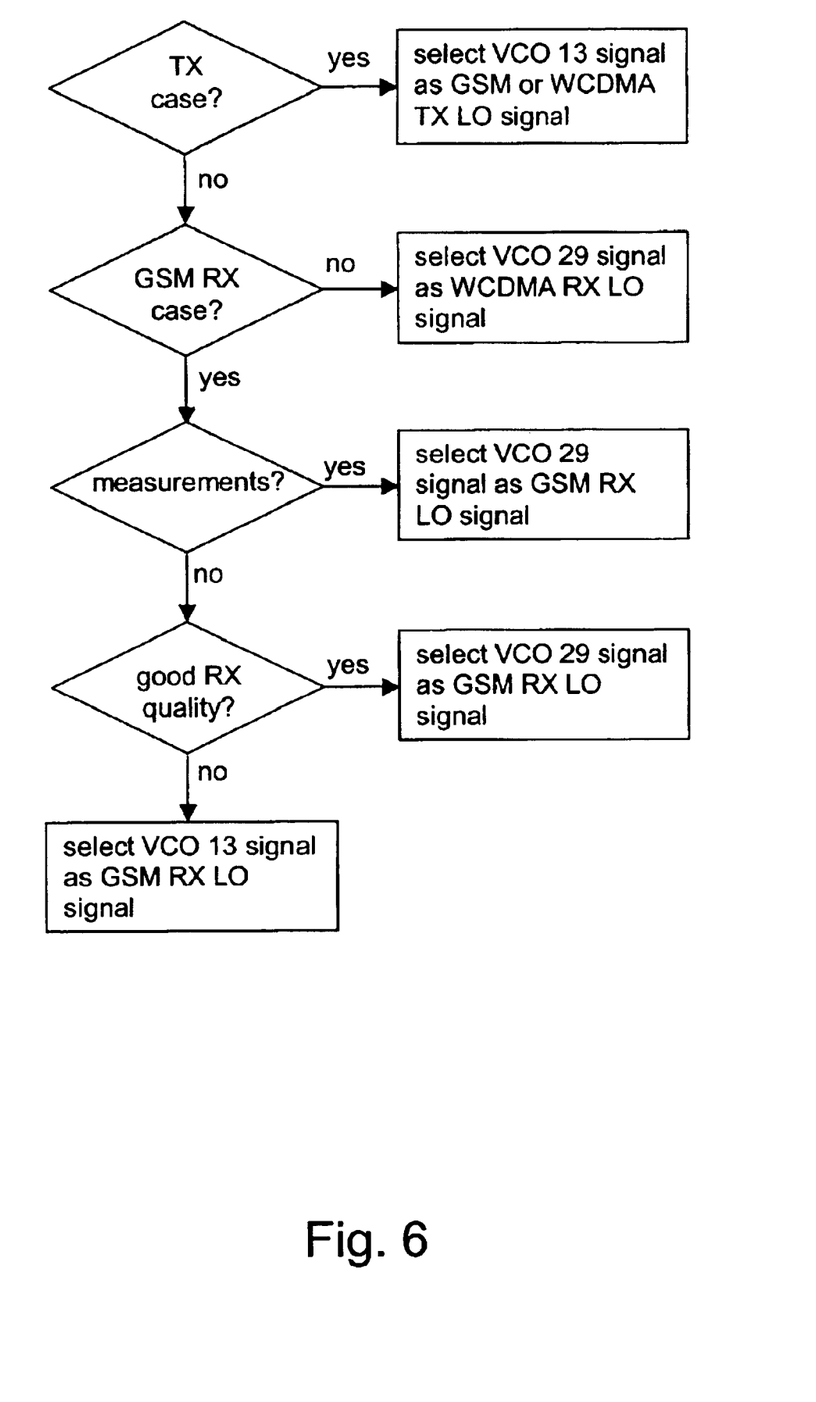
FIG. 6 is a flow chart illustrating one possible switching alternative in the PLL structure of FIG. 5.

When a GSM or WCDMA transmission is needed, the TX VCO 13 is set to the required frequency and the output signal is provided via the RX LO output 17 to the transmitter chain, as known in the state of the art.

When a WCDMA reception or a GSM neighboring measurement is needed, the RX VCO 29 is set to the required frequency and the output signal is provided to the multiplexer 30.

The control unit 32 applies a control signal to the multiplexer 30 which causes the multiplexer 30 to forward the signal originating from the RX VCO 29 to the RX LO output 27.

When a GSM reception is needed, the DSP software in the control unit 32 first evaluates the available SNR of received GSM signals. When a high SNR of received GSM signals is determined, i.e. when no disturbing signals like blocking signals are detected, a high dynamic range is not required. In this case, the control unit 32 applies a control signal to the multiplexer 30 which causes the multiplexer 30 to forward the signal originating from the RX VCO 29 to the RX LO output 27 even in case of a normal GSM reception. Only if disturbing signals are detected by the DSP software does the control unit 32 apply a control signal to the multiplexer 30 which causes the multiplexer 30 to forward the signal originating from the TX VCO 13 to the RX LO output 27. The TX VCO 13, which has a relatively high power consumption, is thus required only in as few situations as possible.

In a second alternative, the PLL structure of FIG. 5 is used in a multislot environment. More specifically, the possibility to generate the RX LO signal in two PLLs is exploited to solve time critical multislot cases of GSM. For example, when a fast neighbor monitoring is needed, the RX VCO 29 may already be settled to the required frequency for the next measurement, while the TX VCO 13 still provides the RX LO signal for a regular GSM reception, and vice versa. The control unit 32 also takes care of switching between the two VCOs 13, 29 in this case. Other constellations can of course be covered as well. As in the first alternative, the all-band RX VCO 29 can have a low performance specification.

In a third alternative, the RX VCO 29 of the PLL structure of FIG. 5 is an all-band RX VCO which fulfills in addition the specifications for all bands, as the RX VCO 23 of FIG. 1. The RX VCO thus also meets the tight technical requirements of GSM. With this third alternative, time critical situations can be taken care of in a particularly comprehensive way. In a time critical reception case, one of the VCOs 13, 29 provides a signal via the multiplexer 30 to the RX LO output 27, while the respective other VCO 29, 13 is set simultaneously to the next frequency required for reception. Then, the control unit 32 causes the multiplexer 30 to provide the signal originating from the other VCO 29, 13 to the RX LO output 27. This will shorten the time required for the receiver to be ready for receiving in a certain channel, as the time required by the PLL for settling to a new frequency between receptions when using a single VCO is avoided. The PLL settling time can be the longest time for awakening the RF part of a receiver, because of the signal purity requirements on the LO signal.

The third alternative enables as well the usage of conventional PLLs with tight filtering in new multislot network configurations.

In a fourth alternative, the RX VCO 29 of the PLL structure of FIG. 5 can be either a low performance VCO as in the second alternative or a high performance VCO as in the third alternative. It may be necessary to switch off one of the VCOs 13, 29 or the corresponding PLL, in case the frequencies of two PLL loops are too close to each other. Depending on the tunability of the VCOs 13, 29, close frequencies may be critical even then when the frequencies are some megahertz apart from each other. The charge pump 11, 21 of the currently unused PLL can be switched in such a case into a high impedance mode, while the reception is carried out using a signal provided by the other PLL via the multiplexer 30 to the RX LO output 27. Then the unused VCO/PLL can be switched off. The control unit 32 takes care of controlling the multiplexer 30 as before and in addition takes care of switching off the VCO/PLL.

Figure 7:
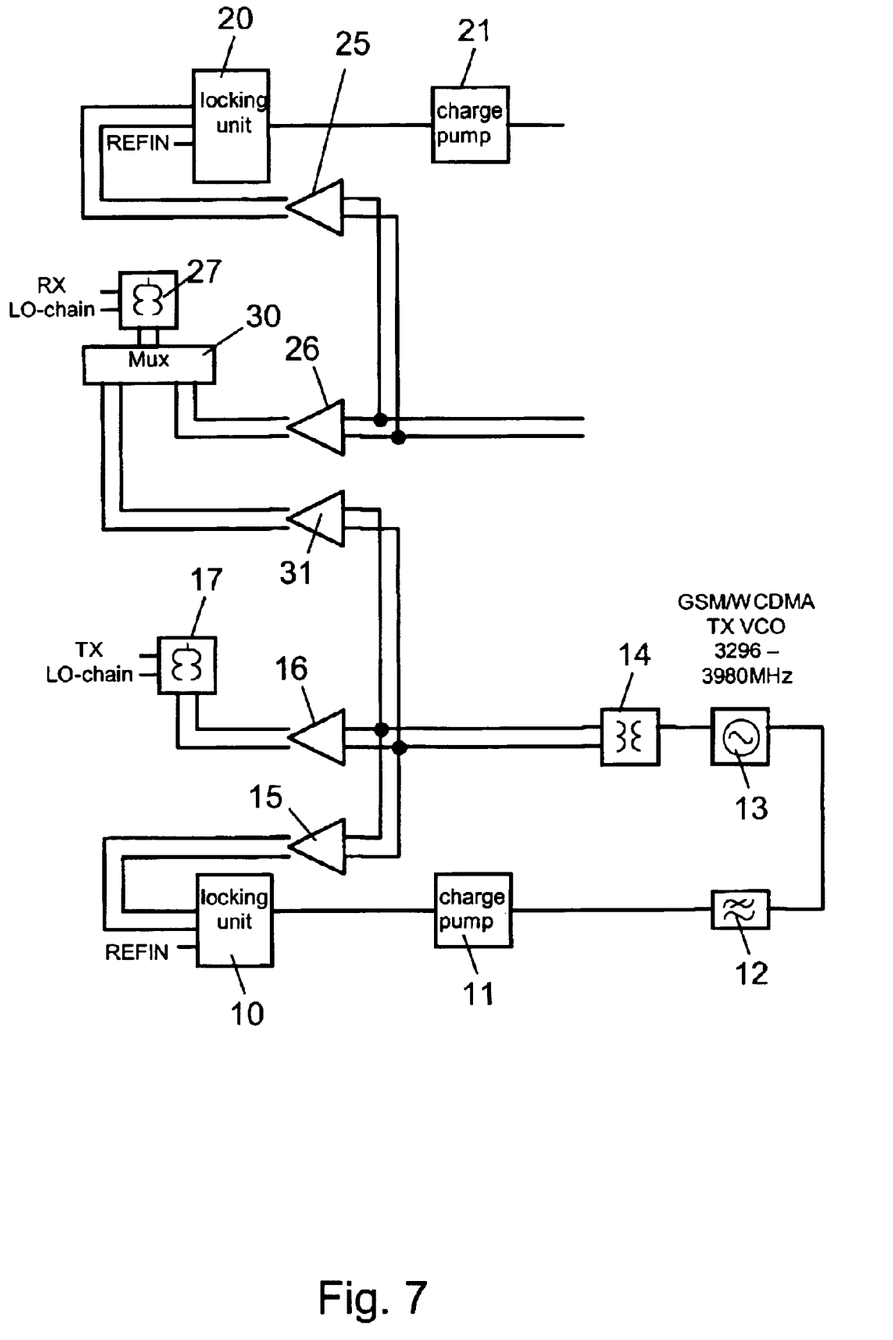
FIG. 7 schematically presents a reduced PLL structure which can be used by itself or be extended to a PLL structure according to the invention.

Finally, FIG. 7 illustrates how the structures presented in FIGS. 3 and 5 for high level multiband/multimode phones can be adapted easily to obtain a low cost solution for low level phones.

FIG. 7 schematically presents a PLL structure which is identical to the structure of FIG. 3, except that the loop filter 22, the RX VCO 28 and the transformer 24 of the second PLL are not present. This reduced PLL structure can be used for a simple GSM phone. Thus, it becomes apparent that the same concept as in FIG. 3 can be used for a simple GSM phone and that savings can be achieved simply by leaving discrete parts or integrated blocks away, or by disabling integrated structures.

The invention thus enables in addition a very easy stripdown solution from a multimode/multiband phone, e.g. a GSM/WCDMA phone, to a very simple and inexpensive multiband GSM phone e.g. by disabling the integrated structures of the second PLL. The circuitry works without any need for component variation.

While there have shown and described and pointed out fundamental novel features of the invention as applied to a preferred embodiment thereof, it will be understood that various omissions and substitutions and changes in the form and details of the devices and methods described may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. A phase-locked loop structure providing local oscillator signals for a multimode system, said phase-locked loop structure comprising:
   a first phase-locked loop including a first voltage controlled oscillator;
   a second phase-locked loop including a second voltage controlled oscillator;
   a first local oscillator output for providing a first local oscillator signal for at least one of said modes, wherein a signal output by said first voltage controlled oscillator is forwarded to said first local oscillator output;
   a second local oscillator output for providing a second local oscillator signal for a selectable one of said modes; and
   a selection component for forwarding a signal output by said first voltage controlled oscillator or a signal output by said second voltage controlled oscillator to said second local oscillator output, said selection component being arranged for forwarding to said second local oscillator output a signal which is output by the voltage controlled oscillator having a lower current consumption, whenever said signal is able to fulfill system requirements on said second local oscillator signal for a currently selected one of said modes.

2. A phase-locked loop structure according to claim 1, wherein said first voltage controlled oscillator is designed to generate signals in a first frequency band, wherein said second voltage controlled oscillator is designed to generate signals in a second frequency band, and wherein said phase-locked loop structure further comprises a control unit applying a control signal to said selection component which causes said selection component to forward a signal output by said first voltage controlled oscillator to said second local oscillator output whenever a second local oscillator signal having a frequency selected from said first frequency band is required and applying a control signal to said selection component which causes said selection component to forward a signal output by said second voltage controlled oscillator to said second local oscillator output whenever a second local oscillator signal having a frequency selected from said second frequency band is required.

3. A phase-locked loop structure according to claim 1, wherein said first voltage controlled oscillator is designed to generate signals having a first quality and said second voltage controlled oscillator is designed to generate signals having a second quality, said first quality being higher than said second quality, and wherein said phase-locked loop structure further comprises a control unit applying a control signal to said selection component which causes said selection component to forward a signal output by said first voltage controlled oscillator to said second local oscillator output whenever a second local oscillator signal having said first quality is required and applying a control signal to said selection component which causes said selection component to forward a signal output by said second voltage controlled oscillator to said second local oscillator output whenever a second local oscillator signal having said second quality is required.

4. A phase-locked loop structure according to claim 1, further comprising:
   at least one control unit, which at least one control unit applies control signals to said selection component causing said selection component to alternate between forwarding a signal output by said first voltage controlled oscillator and a signal output by said second voltage controlled oscillator to said second local oscillator output, and which at least one control unit sets a required frequency of the signal output by a respective voltage controlled oscillator before a control signal is provided to said selection component to switch to forwarding a signal output by said respective voltage controlled oscillator to said second local oscillator output.

5. A phase-locked loop structure according to claim 1, further comprising a control unit, which control unit switches off at least one of said first voltage controlled oscillator and said second voltage controlled oscillator while said first voltage controlled oscillator or said second voltage controlled oscillator is not required for providing a signal to one of said first local oscillator output and said second local oscillator output and while the frequencies of signals currently generated by said first voltage controlled oscillator and said second voltage controlled oscillator are closer to each other than a predetermined difference.

6. A communication unit comprising a transmitter chain requiring a local oscillator signal for processing signals for transmission, wherein said transmitter chain enables a multimode system transmission, a receiver chain requiring a local oscillator signal for processing received signals, wherein said receiver chain enables a multimode system reception, and a phase-locked loop structure providing local oscillator signals, said phase-locked loop structure comprising:

a first phase-locked loop including a first voltage controlled oscillator;

a second phase-locked loop including a second voltage controlled oscillator;

a first local oscillator output for providing a first local oscillator signal for at least one of said modes, wherein a signal output by said first voltage controlled oscillator is forwarded to said first local oscillator output;

a second local oscillator output for providing a second local oscillator signal for a selectable one of said modes; and a selection component for forwarding a signal output by said first voltage controlled oscillator or a signal output by said second voltage controlled oscillator to said second local oscillator output;

wherein one of said first local oscillator output and said second local oscillator output provides a local oscillator signal to said transmitter chain and wherein the respective other one of said first local oscillator output and said second local oscillator output provides a local oscillator signal to said receiver chain.

7. A communication unit according to claim 6, wherein said selection component is arranged for forwarding to said second local oscillator output a signal which is output by the voltage controlled oscillator having a lower current consumption, whenever said signal is able to fulfill system requirements on said second local oscillator signal for a currently selected one of said modes.

8. A method of providing a first local oscillator signal and a second local oscillator signal for a multimode system, said method comprising:

in case said first local oscillator signal is required for one of said modes, using a signal provided by a first voltage controlled oscillator of a first phase locked loop as said first local oscillator signal; and in case said second local oscillator signal is required for a selectable one of said modes, selecting a signal provided by one of said first voltage controlled oscillator and a second voltage controlled oscillator of a second phase locked loop for use as said second local oscillator signal, wherein a signal is selected which is output by the voltage controlled oscillator having a lower current consumption, whenever said signal is able to fulfill system requirements on said second local oscillator signal for a currently selected one of said modes.

9. A method according to claim 8, wherein said first voltage controlled oscillator generates signals in a first frequency band, wherein said second voltage controlled oscillator generates signals in a second frequency band, wherein a signal output by said first voltage controlled oscillator is used as said second local oscillator signal whenever a second local oscillator signal having a frequency selected from said first frequency band is required and wherein a signal output by said second voltage controlled oscillator is used as said second local signal whenever a second local oscillator signal having a frequency selected from said second frequency band is required.

10. A method according to claim 8, wherein said first voltage controlled oscillator generates signals having a first quality and said second voltage controlled oscillator generates signals having a second quality, said first quality being higher than said second quality, wherein a signal output by said first voltage controlled oscillator is used as said second local oscillator signal whenever a second local oscillator signal having said first quality is required, and wherein a signal output by said second voltage controlled oscillator is used as said second local oscillator signal whenever a second local oscillator signal having said second quality is required.

11. A method according to claim 8, wherein a signal output by said first voltage controlled oscillator and a signal output by said second voltage controlled oscillator are used alternately as said second local oscillator signal, said method further comprising setting a required frequency of a signal output by a respective one of said voltage controlled oscillators before a signal output by said voltage controlled oscillator is used as said second local oscillator signal.

12. A method according to claim 8, further comprising switching off at least one of said first voltage controlled oscillator and said second voltage controlled oscillator while a signal generated by said first voltage controlled oscillator or a signal generated by said second voltage controlled oscillator, respectively, is not to be used as one of said first local oscillator signal and said second local oscillator signal, and while the frequencies of signals currently generated by said first voltage controlled oscillator and said second voltage controlled oscillator are closer to each other than a predetermined difference.

13. A phase-locked loop structure providing local oscillator signals, said phase-locked loop structure comprising:

a first phase-locked loop including a first voltage controlled oscillator;

a second phase-locked loop including a second voltage controlled oscillator;

a first local oscillator output for providing a first local oscillator signal, wherein a signal output by said first voltage controlled oscillator is forwarded to said first local oscillator output;

a second local oscillator output for providing a second local oscillator signal;

a selection component for forwarding a signal output by said first voltage controlled oscillator or a signal output by said second voltage controlled oscillator to said second local oscillator output; and a control unit, which control unit switches off at least one of said first voltage controlled oscillator and said second voltage controlled oscillator while said first voltage controlled oscillator or said second voltage controlled oscillator is not required for providing a signal to one of said first local oscillator output and said second local oscillator output and while the frequencies of signals currently generated by said first voltage controlled oscillator and said second voltage controlled oscillator are closer to each other than a predetermined difference.

14. A method of providing a first local oscillator signal and a second local oscillator signal, said method comprising:

in case said first local oscillator signal is required, using a signal provided by a first voltage controlled oscillator of a first phase locked loop as said first local oscillator signal;

in case said second local oscillator signal is required, selecting a signal provided by one of said first voltage controlled oscillator and a second voltage controlled oscillator of a second phase locked loop for use as said second local oscillator signal; and switching off at least one of said first voltage controlled oscillator and said second voltage controlled oscillator while a signal generated by said first voltage controlled oscillator or a signal generated by said second voltage controlled oscillator, respectively, is not to be used as one of said first local oscillator signal and said second local oscillator signal, and while the frequencies of signals currently generated by said first voltage controlled oscillator and said second voltage controlled oscillator are closer to each other than a predetermined difference.

* * * * *